United States Patent [19]
Petersen

[11] 3,958,230
[45] May 18, 1976

[54] ARRANGEMENT INCLUDING A PIEZO-FERROELECTRIC BODY

[75] Inventor: August Petersen, Henstedt-Ulzburg, Germany

[73] Assignee: U.S. Philips Corporation, New York, N.Y.

[22] Filed: Nov. 7, 1974

[21] Appl. No.: 521,587

[30] Foreign Application Priority Data
Nov. 10, 1973 Germany............................ 2356256

[52] U.S. Cl. ..................... 340/173.2; 340/173 NR; 331/107 A
[51] Int. Cl.² ....................................... G11C 11/22
[58] Field of Search ................ 340/173.2, 173 NR; 331/107 A

[56] References Cited
UNITED STATES PATENTS
3,535,686  10/1970  Barnett ........................... 340/172.5

Primary Examiner—Terrell W. Fears
Attorney, Agent, or Firm—Frank R. Trifari; Bernard Franzblau

[57] ABSTRACT

For reducing or preventing unwanted variations at adjacent storage electrodes upon polarization or depolarization of one of the storage electrodes on a PXE body a storage electrode terminating impedance is proposed of a special value.

9 Claims, 1 Drawing Figure

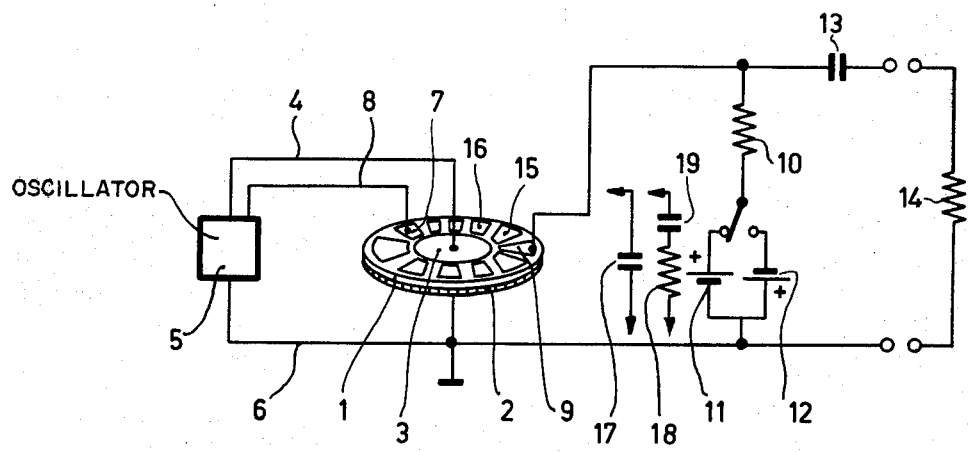

ARRANGEMENT INCLUDING A PIEZO-FERROELECTRIC BODY

The invention relates to a circuit arrangement including a piezo-ferroelectric body one end face of which is provided with a driver electrode coupled to a driving oscillator and with at least two storage electrodes, and the other end face of which is provided with a counter electrode arrangement.

Such a circuit arrangement including a piezo-ferroelectric body is known, for example, from the U.S. Pat. No. 3,535,686. It shows a piezo-ferroelectric body in a preferred structure, namely the piezo-ferroelectric body in the form of a very thin disk supporting a counter electrode on one side and on the other side a driver electrode surrounded by a plurality of storage electrodes in an array of segments.

The German Auslegeschrift No. 2003396 describes the possibility of using an arrangement including a piezo-ferroelectric body for controlling electronic circuits by means of analog signals, particularly in television receivers, by varying the properties of the body. It also describes how to equip the driving oscillator, required for each piezo-ferroelectric body, with a feedback and to derive this feedback from a further electrode on the piezo-ferroelectric body. Such feedback provides a greater stability of the oscillator, but it requires a further electrode which cannot be used for storage purposes. Extensive investigations have shown that the following effect can be observed in the known circuit arrangements: when a piezo-ferroelectric body is polarized only once and is permanently included in a circuit arrangement, for example for a filter, the negligibly small variation of the stored value stated to be ± 1% in one of the above-mentioned articles is not disturbing at all. However, when the piezo-ferroelectric body is to be used in a control device of, for instance, a television receiver, it is important that the arrangement be adapted in such a manner that a frequent switch-over or reversal of the polarity of the separate regions of the piezo-ferroelectric body under the corresponding storage electrodes may occur. It was found by the Applicant that when the polarisation or depolarisation under a storage electrode is varied, the condition under other storage electrodes also varies, albeit to a must lesser extent, dependent on the construction and design of the electrodes.

The degree of this influence may be partly reduced by arranging a feedback branch in the driving circuit, i.e. in the oscillator circuit, but this influence does not entirely disappear.

An object of the invention is to reduce the variation of the electromechanical characteristics of the body and to prevent the variation of the amplitude or amplitudes of the alternating voltage or voltages on the other storage electrode or electrodes. When a partial polarisation or depolarisation under a storage electrode is produced a circuit arrangement as described in the preamble according to the invention is characterized in that an impedance is arranged between one storage electrode and a corresponding part of the counter electrode arrangement for reducing the variation of the electromechanical characteristics of the body and hence for preventing the variation of the amplitude(s) of the alternating voltage(s) at the other storage electrode(s) upon partial polarisation or depolarisation of the body under the storage electrode, which impedance is resistive or capacitive and corresponds in absolute value approximately to the absolute value of the impedance of the self capacitance of the relevant part of the piezo-ferroelectric body with the associated electrodes at the oscillator frequency. This means that the output circuit must not be adapted for maximum energy transfer but must have an input impedance which corresponds to the impedance of the capacitance of the relevant part, namely the part below the associated storage electrode up to and including the associated counter electrode. It is advantageous to use a capacitor for the terminating impedance, i.e. for the exterior circuitry of a storage electrode. The impedance may alternatively be a resistor and its value must then be approximately equal to the value of the impedance of the inherent capacitance of the relevant part of the piezo-ferroelectric body at the oscillator frequency.

It is achieved by the use of the terminating impedances that the elasticity of the part of the piezoelectric body associated with the storage field only varies with the state of polarisation. Very large terminating impedances generally result in an elasticity which decreases with the polarisation, whereas very small terminating impedances lead to the opposite state. The optimum terminating impedances depend on the material, the geometry and the oscillatory mode and, as already stated, they are in the order of the impedance of the inherent capacitance.

Partial elasticity variations in the piezo-ferroelectric body as they may occur without the above-mentioned steps lead to a variation of the mechanical oscillation-amplitude ratio in the complete body acting on the other storage fields to various extents so that a reduction of this effect by means of a feedback circuit is not possible.

Since the polarisation-dependent variations of the characteristics also lead to variations in the mechanical and electrical losses, a variation of the signal voltage which is equally large for all storage fields also occurs across the varied damping of the complete body. This is likewise considerably reduced by the above-mentioned steps, but on the other hand a feedback circuit is also suitable for this purpose.

An embodiment of the invention is shown in the drawing and will be further described hereinafter.

In the FIGURE the reference numeral 1 is the piezo-ferroelectric body in the form of a thin disk. This disk is approximately 0.15 mm high and has a diameter of approximately 10 mm. A counter electrode 2 is provided on this disk on the lower end face and covers this lower end face completely. An electrode 3 is centrally provided on the upper end face. This electrode 3 is the driver electrode or oscillator electrode and is connected through a lead 4 to the oscillator 5. The oscillator generates a signal with a frequency of, for example, approximately 250 KHz. The other connection 6 of the oscillator leads to a common reference point to which also the counter electrode 2 is connected. The counter electrode may consist of several parts if desired.

A number of storage electrodes surround the electrode 3, thus about the circular centrally located driver electrode 3. Each storage electrode has the form of a segment. One storage electrode 7 may be connected through a lead 8 to the oscillator 5. This storage electrode 7 has the property of a feedback electrode because it forms a feedback path for the oscillator in known manner.

A storage electrode is denoted by reference numeral 9. This storage electrode 9 is connected to an output circuit comprising a polarisation or depolarisation circuit consisting of a resistor 10 which has generally a very high resistive value, for example, 20 MOhm, a battery 11 for polarisation and a battery 12 for depolarisation. These are actually direct current sources which can produce voltages of up to, for example, 500 V. The batteries 11 and 12 are selectively connected to the storage electrode 9 by means of a switch. An alternating current circuit is coupled through a capacitor 13 and an actual load resistor 14 across which the output alternating voltage can be measured.

When the polarisation or depolarisation between the counter electrode 2 and the storage electrode 9 is varied, the corresponding values under other storage electrodes, denoted by reference numerals 15 and 16, might also vary. These storage electrodes are also connected to output alternating current circuits and also to a circuit for polarisation or depolarisation, but these circuits are not shown for the sake of clearness. They are principally the same as that connected to the electrode 9.

In order to limit the variation of the electromechanical characteristics below the other storage electrodes to as small a value as possible, and hence to reduce the variation in amplitudes of the alternating voltages at these storage electrodes to a negligible extent in case of a partial polarisation or depolarisation of the piezo-ferroelectric body 1 below one storage electrode 9, an impedance is arranged, according to the invention, between this storage electrode 9 and the associated counter electrode 2. This impedance corresponds approximately to the self capacitance of the relevant part of the piezo-ferroelectric body at the oscillator frequency. This impedance may be a capacitor and is denoted by 17. This impedance may alternatively consist of the d.c. separated resistor denoted by 18 whose value must then be approximately equal to the self capacitance at the oscillator frequency.

If the capacitor 17 may have a value of approximately 200 pF. The piezo-ferroelectric disk had the dimensions as stated above and the storage electrode 9 had a surface of approximately 3 sq.mm., the resistor could have a value of, for example, 3 kOhm.

I claim:

1. A circuit arrangement comprising a piezo-ferroelectric body having one end face provided with a driver electrode coupled to a driving oscillator and with at least two storage electrodes, a counter electrode provided on the other end face of said body, and an impedance element connected between one storage electrode and a corresponding part of the counter electrode for reducing the variation of the electromechanical characteristics of the body and hence for preventing the variation of the amplitude of the alternating voltage at least one other storage electrode upon partial polarisation or depolarisation of the body under the storage electrode, the absolute value of the impedance element being approximately equal to the absolute value of the impedance of the inherent capacitance of the relevant part of the piezo-ferroelectric body at the oscillator frequency.

2. A circuit arrangement as claimed in claim 1, wherein the impedance element comprises a capacitor.

3. A circuit arrangement as claimed in claim 1, wherein the impedance element comprises a resistor whose value is approximately equal to the value of the impedance of the inherent capacitance of the storage electrode at the oscillator frequency.

4. A circuit comprising, a piezoelectric body having a first electrode on one end surface thereof, a second electrode on a first portion of the opposite surface of the body and a plurality of storage electrodes on other portions of said opposite surface of the body, means for applying an AC voltage across said first and second electrodes, and an impedance element connected between one storage electrode and said first electrode for reducing the effects of a variation of the polarization of the body under said one storage electrode on adjacent storage electrodes, the impedance of said impedance element being approximately equal to the impedance of the inherent capacitance of the relevant part of the piezoelectric body at the frequency of the applied AC voltage.

5. A circuit as claimed in claim 4 further comprising means coupled to said one storage electrode and to said first electrode for varying the polarization of the piezoelectric body between said electrodes.

6. A circuit as claimed in claim 5 wherein said polarization varying means includes means for selectively polarizing the part of the body between said electrodes in opposite directions.

7. A circuit as claimed in claim 5 further comprising means for coupling an electric load across said one storage electrode and said first electrode.

8. A circuit as claimed in claim 4 wherein said impedance element comprises a capacitor.

9. A circuit as claimed in claim 4 wherein said impedance element comprises a resistor whose resistance is approximately equal to the impedance of the inherent capacitance of the one storage electrode at the frequency of the AC voltage.

* * * * *